(12) United States Patent
Miller et al.

(10) Patent No.: US 9,114,423 B2
(45) Date of Patent: Aug. 25, 2015

(54) REPAIRING GRAPHENE ON A POROUS SUPPORT

(75) Inventors: Seth Adrian Miller, Englewood, CO (US); Gary L. Duerksen, Ward, CO (US)

(73) Assignee: Empire Technology Development LLC, Wilmington, DE (US)

(*) Notice: Subject to any disclaimer, the term of this patent is extended or adjusted under 35 U.S.C. 154(b) by 32 days.

(21) Appl. No.: 13/809,543

(22) PCT Filed: Jul. 25, 2012

(86) PCT No.: PCT/US2012/048146
§ 371 (c)(1),
(2), (4) Date: Jan. 10, 2013

(87) PCT Pub. No.: WO2014/018030
PCT Pub. Date: Jan. 30, 2014

(65) Prior Publication Data
US 2014/0030465 A1    Jan. 30, 2014

(51) Int. Cl.
*B32B 3/24* (2006.01)
*B05D 5/00* (2006.01)
(Continued)

(52) U.S. Cl.
CPC .............. *B05D 5/005* (2013.01); *B01D 65/108* (2013.01); *B82Y 30/00* (2013.01); *B82Y 40/00* (2013.01); *C01B 31/0484* (2013.01);
(Continued)

(58) Field of Classification Search
CPC .... B05D 5/005; C01D 31/0484; C01D 31/00; B01D 69/12; B01D 69/122; B01D 65/108; Y10T 428/20; Y10T 428/24347; Y10T 428/24339

USPC ............................ 428/139; 427/140; 118/600
See application file for complete search history.

(56) References Cited

U.S. PATENT DOCUMENTS

| 4,602,922 A | 7/1986 | Cabasso |
| 4,664,669 A | 5/1987 | Ohyabu |

(Continued)

FOREIGN PATENT DOCUMENTS

| CN | 101774575 A | 7/2010 |
| EP | 2138222 A1 | 12/2009 |

(Continued)

OTHER PUBLICATIONS

Jiang, D. et al., Porous Graphene as the Ultimate Membrane for Gas Separation, Nano Lett., 2009, 4019-4024, 9 (12).

(Continued)

*Primary Examiner* — William P Watkins, III
(74) *Attorney, Agent, or Firm* — Moritt Hock & Hamroff LLP; Steven S. Rubin, Esq.

(57) ABSTRACT

Technologies described herein are generally related to repairing graphene on a porous support. In some examples, a method is described that may include receiving a graphene layer on a support. The graphene layer may include a hole and a pore. The method may further include applying a first reactive material to a first side of the graphene layer. The first reactive material may include molecules larger than the pore. A second reactive material may be applied through the support to a second side of the graphene layer. The second reactive material may include molecules larger than the pore. The first and second reactive materials may react in the hole to produce a plug in the hole and to repair the graphene layer.

23 Claims, 7 Drawing Sheets

(51) Int. Cl.

| | |
|---|---|
| B01D 65/10 | (2006.01) |
| C01B 31/04 | (2006.01) |
| C30B 29/02 | (2006.01) |
| B82Y 30/00 | (2011.01) |
| B82Y 40/00 | (2011.01) |

(52) U.S. Cl.
CPC .............. *C30B 29/02* (2013.01); *Y10T 428/20* (2015.01); *Y10T 428/24339* (2015.01); *Y10T 428/24347* (2015.01)

(56) References Cited

U.S. PATENT DOCUMENTS

| | | | |
|---|---|---|---|
| 4,741,829 | A | 5/1988 | Takemura |
| 4,863,496 | A * | 9/1989 | Ekiner et al. ................... 427/245 |
| 5,045,354 | A | 9/1991 | Feimer |
| 5,091,216 | A * | 2/1992 | Ekiner et al. ................... 427/245 |
| 5,702,503 | A | 12/1997 | Tang |
| 5,710,187 | A | 1/1998 | Steckler |
| 6,409,921 | B1 | 6/2002 | Muller |
| 6,442,144 | B1 | 8/2002 | Hansen et al. |
| 6,730,145 | B1 * | 5/2004 | Li ...................................... 96/10 |
| 7,846,738 | B2 | 12/2010 | Golovchenko et al. |
| 7,947,114 | B2 * | 5/2011 | Hagg et al. .......................... 95/51 |
| 8,551,650 | B2 | 10/2013 | Kung et al. |
| 2010/0178464 | A1 | 7/2010 | Choi et al. |
| 2011/0017390 | A1 | 1/2011 | Blake et al. |
| 2011/0017587 | A1 | 1/2011 | Zhamu et al. |
| 2011/0201201 | A1 | 8/2011 | Arnold et al. |
| 2011/0240947 | A1 | 10/2011 | Yang et al. |
| 2011/0240951 | A1 | 10/2011 | Yang et al. |
| 2012/0148829 | A1 | 6/2012 | Krogman et al. |
| 2013/0052489 | A1 | 2/2013 | Zhamu et al. |
| 2013/0059174 | A1 | 3/2013 | Zhamu |
| 2013/0162216 | A1 | 6/2013 | Zhamu et al. |
| 2013/0186758 | A1 | 7/2013 | Saha et al. |
| 2013/0192461 | A1 | 8/2013 | Miller et al. |
| 2013/0202945 | A1 | 8/2013 | Zhamu et al. |
| 2013/0270188 | A1 | 10/2013 | Karnik et al. |
| 2014/0107326 | A1 | 4/2014 | Swager et al. |
| 2014/0183133 | A1 | 7/2014 | Anderson et al. |

FOREIGN PATENT DOCUMENTS

| | | |
|---|---|---|
| WO | WO2007017650 A1 | 2/2007 |
| WO | WO2011094204 A2 | 8/2011 |
| WO | 2011150325 A2 | 12/2011 |
| WO | 2012005857 A1 | 1/2012 |

OTHER PUBLICATIONS

Schrier, J., Helium Separation Using Porous Graphene Membranes, J. Phys. Chem. Lett., 2010, 2284-2287, 1 (15).

Henis, J.M.S. & Tripodi, M.K., A Novel Approach to Gas Separation Using Composite Hollow Fibre Membranes, Separation Science and Technology, 1980, 1059, 15.

Li, X. et al., Transfer of Large-Area Graphene Films for High-Performance Transparent Conductive Electrodes, Nano Letters, 2009, 4359-4363, vol. 9.

Unarunotai, S. et al., Transfer of graphene layers grown on SiC wafers to other substrates and their integration into field effect transistors, 2009 Appl. Phys. Lett., 3 pages, 95.

Patole, A. S. et al., A facile approach to the fabbrication of graphene/polystyrene nanocomposite by in situ microemulsion polymerization, Journal of Colloid and Interface Science, 2010, 530-537, 350.

Saufi, S. M. & Ismail, A. F., Fabrication of carbon membranes for gas separation—a review, Carbon, 2004, 241-259, 42.

Zhang, M. et al., Production of Graphene Sheets by Direct Dispersion with Aromatic Healing Agents, Small, May 2010, 1 page.

Steenackers, M. et al., Polymer Brushes on Graphene, Journal of American Chemical Society, 2011, 10490-10498, 133 (27).

Chen, R. et al., Grafting Acrylic Polymers from Flat Nickel and Copper Surfaces by Surface-Initiated Atom Transfer Radical Polymerization, Langmuir, 2008, 6889-6896, 24 (13).

Regan, W. et al., A direct transfer of layer-area graphene, Appl. Phys. Lett., 2010, 3 pages, 96.

Lee, Y. et al., Wafer-scale Synthesis and Transfer of Graphene Films, Nano Lett., 2010, 490-493, 10.

International Search Report and Written Opinion for application with application No. PCT/US2012/048146, dated Oct. 5, 2012, 8 pages.

International Search Report and Written Opinion for application with application No. PCT/US2012/048154, dated Oct. 5, 2012, 10 pages.

"Functionalized Polymers," Polymer Source, accessed at http://www.polymersource.com/product.php?ID=689, accessed on Aug. 8, 2014, p. 1.

"Nitrine," Wikipedia, accessed at https://web.archive.org/web/20090609015900/http://en.wikipedia.org/wiki/Nitrene, Last modified on May 20, 2009, pp. 1-4.

"Thin Film Composite Membrane," Wikipedia, accessed at https://web.archive.org/web/20120401025219/http://en.wikipedia.org/wiki/Thin_film_composite_membrane, Last modified on Mar. 24, 2012, pp. 1-3.

Bekyarova, E., et al., "Chemical Modification of Epitaxial Graphene: Spontaneous Grafting of Aryl Groups," J. Am. Chem. Soc., 2009, pp. 1336-1337, vol. 131, Issue 4.

Blankenburg, S., et al., "Porous Graphene as an Atmospheric Nanofilter," Wiley-VCH Verlag GmbH & Co. KGaA, 2010, pp. 2266-2271, vol. 6, No. 20.

Bunch, J. S., et al., "Impermeable Atomic Membranes from Graphene Sheets," Nano Lett., 2008, pp. 2458-2462, vol. 8, No. 8.

Choi, J., et al., "Covalent Functionalization of Epitaxial Graphene by Azidotrimethylsilane," J. Phys. Chem. C., 2009, pp. 9433-9435, vol. 113, No. 22.

Deng, Z. W., and Souda, R., "Dissociative thermal-electron attachment at a surface: CN-emission from nitrogen ion irradiated graphite," Surface Science, 2001, pp. 393-398, vol. 488, Issue 3.

Hong, M., et al., "Hydrogen purification using a SAPO-34 membrane," Journal of Membrane Science, 2008, pp. 277-283, vol. 307, Issue 2.

International Search Report and Written Opinion for application PCT/US12/22798, mailed Jun. 22, 2012, 10 pages.

Koehler, F. M., et al., "Permanent Pattern-Resolved Adjustment of the Surface Potential of Graphene-Like Carbon through Chemical Functionalization," Angew. Chem. Int. Ed. 2009, pp. 224-227, vol. 48, Issue 1.

Lee, S. H., et al., "Polymer Brushes via Controlled, Surface-Initiated Atom Transfer Radical Polymerization (ATRP) from Graphene Oxide," Macromolecular Rapid Communications, 2010, pp. 281-288, vol. 31, Issue 3.

Liu, L.-H., and Yan, M., "A Simple Method for the Covalent Immobilization of Graphene," Nano Lett., 2009, pp. 3375-3378, vol. 9, No. 9.

Liu, S.-L., et al., "Preparation and Property of Some Azidosilanes," Chemistry Research Center, National Taiwan Taipei Taiwan, 1970, pp. 229-234, vol. 17, Issue 4.

Molbur, J. C., and Doctor, R. D., "Hydrogen from Steam-Methane Reforming with CO2 Capture," 20th Annual International Pittsburgh Coal Conference, 2003, pp. 1-21.

Salavagione, H. J., et al., "Recent Advances in the Covalent Modification of Graphene with Polymers," Macromolecular Rapid Communications, 2011, pp. 1771-1789, vol. 32, Issue 22.

Warner, D. L., et al., "N-Silyl Protecting Groups for Labile Aziridines: Application toward the Synthesis of N-H Aziridinomitosenes," J. Org. Chem., 2007, pp. 8519-8522, vol. 72, Issue 22.

* cited by examiner

REPAIRING GRAPHENE ON A POROUS SUPPORT

CROSS REFERENCE TO RELATED APPLICATIONS

This application is a U.S. national stage filing under 35 U.S.C. §371 of International Application No. PCT/US2012/048146 filed Jul. 25, 2012, the entirety of which is hereby incorporated by reference. The present application is related to the following application: PCT Patent Application No. PCT/US2012/048154, entitled "GRAPHENE MEMBRANE REPAIR" naming Seth Miller and Gary Duerksen as inventors, filed Jul. 25, 2012 which is currently co-pending.

BACKGROUND

Unless otherwise indicated herein, the materials described in this section are not prior art to the claims in this application and are not admitted to be prior art by inclusion in this section.

Graphene is a material that generally may include a one atom thick layer of bonded carbon atoms. Graphene may be formed by growing carbon atoms on top of another material such as copper. The copper may be inserted into a quartz tube, heated, and annealed. A gas mixture of $CH_4$ and $H_2$ may then be flowed into the tube and the copper may then be cooled with flowing $H_2$ to form graphene.

SUMMARY

In some examples, methods for repairing graphene are generally described. Example methods may include receiving a graphene layer on a support. The graphene layer may include a hole and a pore. The method may further include applying a first reactive material to a first side of the graphene layer. The first reactive material may include molecules larger than the pore. The method may further include applying a second reactive material through the support to a second side of the graphene layer. The second reactive material may include molecules larger than the pore. The method may include reacting the first and second reactive materials in the hole to produce a plug in the hole and to repair the graphene layer.

In some examples, a system effective to repair a graphene layer on a support is generally described. An example graphene layer may include a hole and a pore. Example systems may include a chamber, a first container, and a second container. The chamber may be effective to receive the graphene layer on the support. The first container may be in operative relationship with the chamber. The first container may include a first reactive material. The first reactive material may include molecules larger than the pore. The second container may be in operative relationship with the chamber. The second container may include a second reactive material. The second reactive material may include molecules larger than the pore. The chamber may be effective to operate with the first container to apply the first reactive material to a first side of the graphene layer. The first reactive material may include molecules larger than the pore. The chamber may be effective to operate with the second container to apply the second reactive material through the support to a second side of the graphene layer. The second reactive material may include molecules larger than the pore. The chamber may be effective to operate with the first and the second container to react the first and second reactive materials in the hole to produce a plug in the hole and to repair the graphene layer.

In some examples, a structure is generally described. Example structures may include a porous support. The porous support may include pores of a first size. The structure may include a graphene layer on the support. The graphene layer may include a hole. The graphene layer may further include a pore of a second size. The structure may further include a plug in the hole. The plug may include a first material with molecules having a third size larger than the second size and smaller than the first size. The plug may include a second material with molecules having a fourth size larger than the second size and smaller than the first size.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to systems, methods, materials and apparatus related to repairing graphene on a porous support.

Briefly stated, technologies are generally described related to repairing graphene on a porous support. In some examples, methods are described that may include receiving a graphene layer on a support. An example graphene layer may include a hole and a pore. Some methods may further include applying a first reactive material to a first side of the graphene layer. The first reactive material may include molecules larger than the pore. A second reactive material may be applied through the support to a second side of the graphene layer. The second reactive material may include molecules larger than the pore. The first and second reactive materials may react in the hole to produce a plug in the hole and to repair the graphene layer.

It will be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

Figure 1:
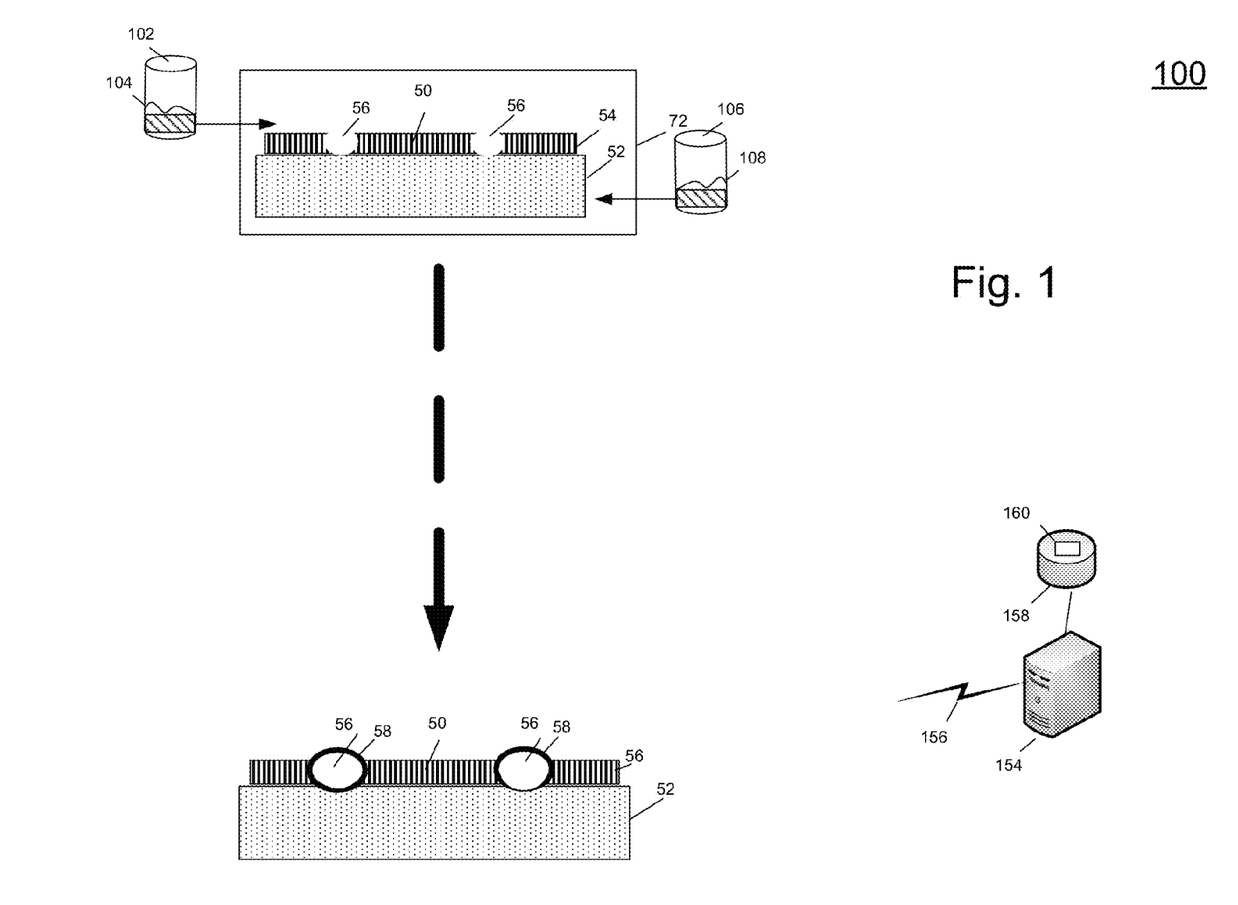
FIG. 1 illustrates an example system that can be utilized to implement repairing graphene on a porous support.

FIG. 1 illustrates an example system that can be utilized to implement repairing graphene on a porous support arranged in accordance with at least some embodiments described herein. An example graphene repair system 100 may include one or more of a first container 102, a second container 106, a support 52, a graphene membrane or graphene layer 54 and/or a chamber 72 all configured in operative relationship with respect to one another. At least some of elements of graphene membrane repair system 100 may be arranged in communication with a processor 154 through a communication link 156. In some examples, processor 154 may be adapted in communication with a memory 158 that may include instructions 160 stored therein. Processor 154 may be configured, such as by instructions 160, to control at least some of the operations/actions/functions described below.

As discussed in more detail below, graphene membrane 54 may include desired pores 50 and undesired holes 56. Desired pores 50 may be formed through patterning to create molecule sized holes. Desired pores 50 may be, for example, about 1 Å to about 1 nm in length or diameter. In an example, desired pores 50 may be generally unaffected by application of a graphene membrane repair process discussed herein. First container 102 may be configured to operate with chamber 72 to apply a first reactive material 104 to a first side of graphene layer 54. Second container 106 may be configured to operate with chamber 72 to apply a second reactive material 108 through porous support 52 to a second side of graphene layer 54. First reactive material 104 and second reactive material 108 may have molecules larger than pores 50 and may react in holes 56 and form plugs 58 in holes 56. Plugs 58 may effectively close or substantially plug undesired holes 56 to repair layer 54. Support 52 may be porous and may include pores of a size larger (e.g., in diameter and/or length) than the molecules in the first and second reactive material.

Figure 2:
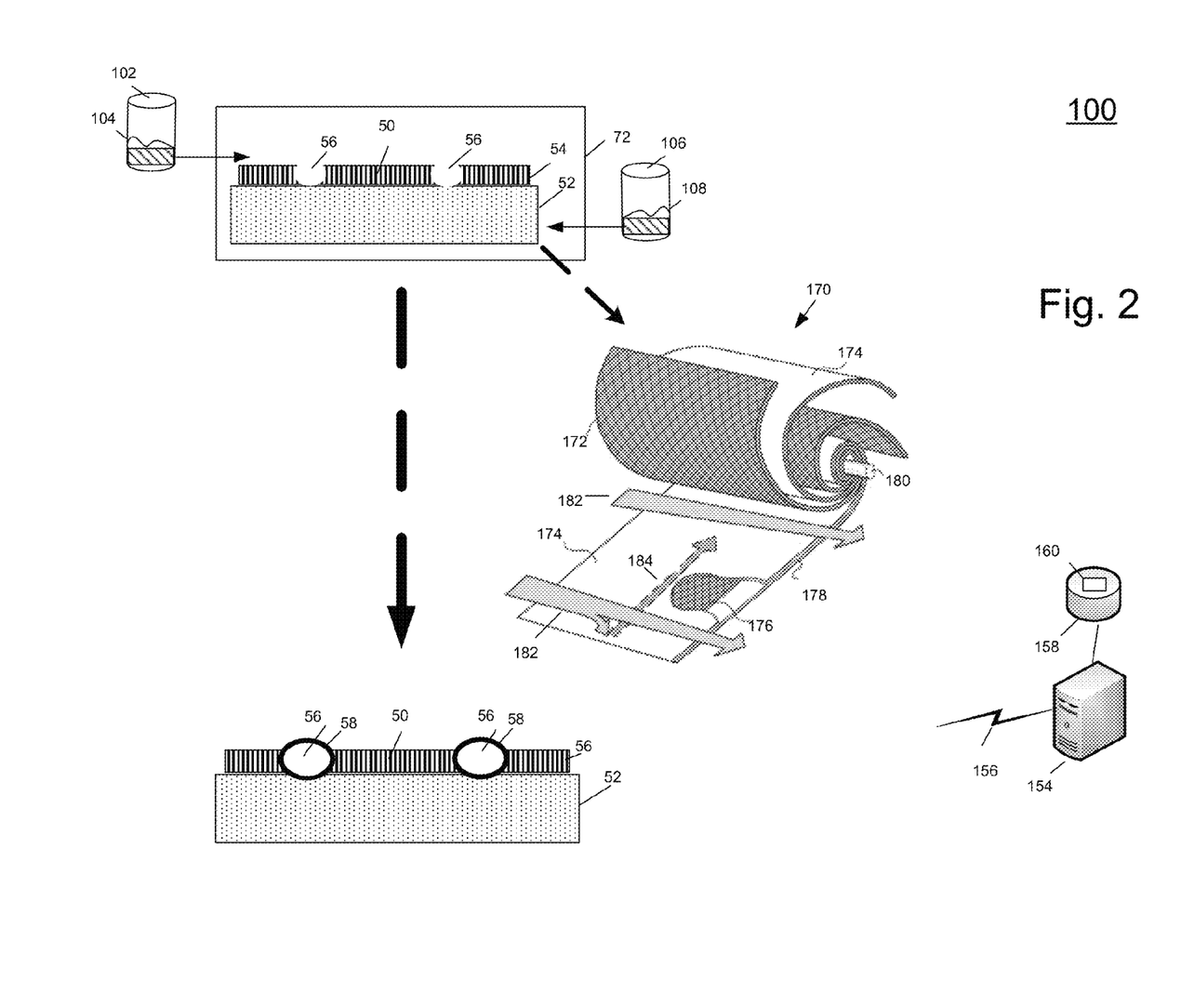
FIG. 2 illustrates an example system that can be utilized to implement repairing graphene on a porous support.

FIG. 2 illustrates an example system that can be utilized to implement repairing graphene on a porous support arranged in accordance with at least some embodiments described herein. FIG. 2 is substantially similar to system 100, with additional details. Those components in FIG. 2 that are labeled identically to components of FIG. 1 will not be described again for the purposes of clarity.

Graphene layer 54 and porous support 52 may be wound in a spiral wound module 170. Chamber 72 may include spiral wound module 170. First reactive material 104 and second reactive material 108 may be applied to graphene layer 54 while graphene layer 54 and porous support 52 are wound in spiral wound module 170. Spiral wound module 170 may include a membrane 174. Membrane 174 may include including graphene layer 54 and porous support 52. A spacer 172 may be layered on top of membrane 174 and the combination of spacer 172 and membrane 174 may be wrapped around a collection pipe 180. First reactive material 104 may be flowed through spiral wound module 170 in either flow direction 182 through pipe 180 or flowed in flow direction 184. Second reactive material 108 may be flowed through spiral wound module 170 in the other of flow direction 182 through pipe 180 or flow direction 184. First reactive material 104 may contact and react with second reactive material 108 through holes 56. The contacting and reacting may produce plugs 58.

Figure 3:
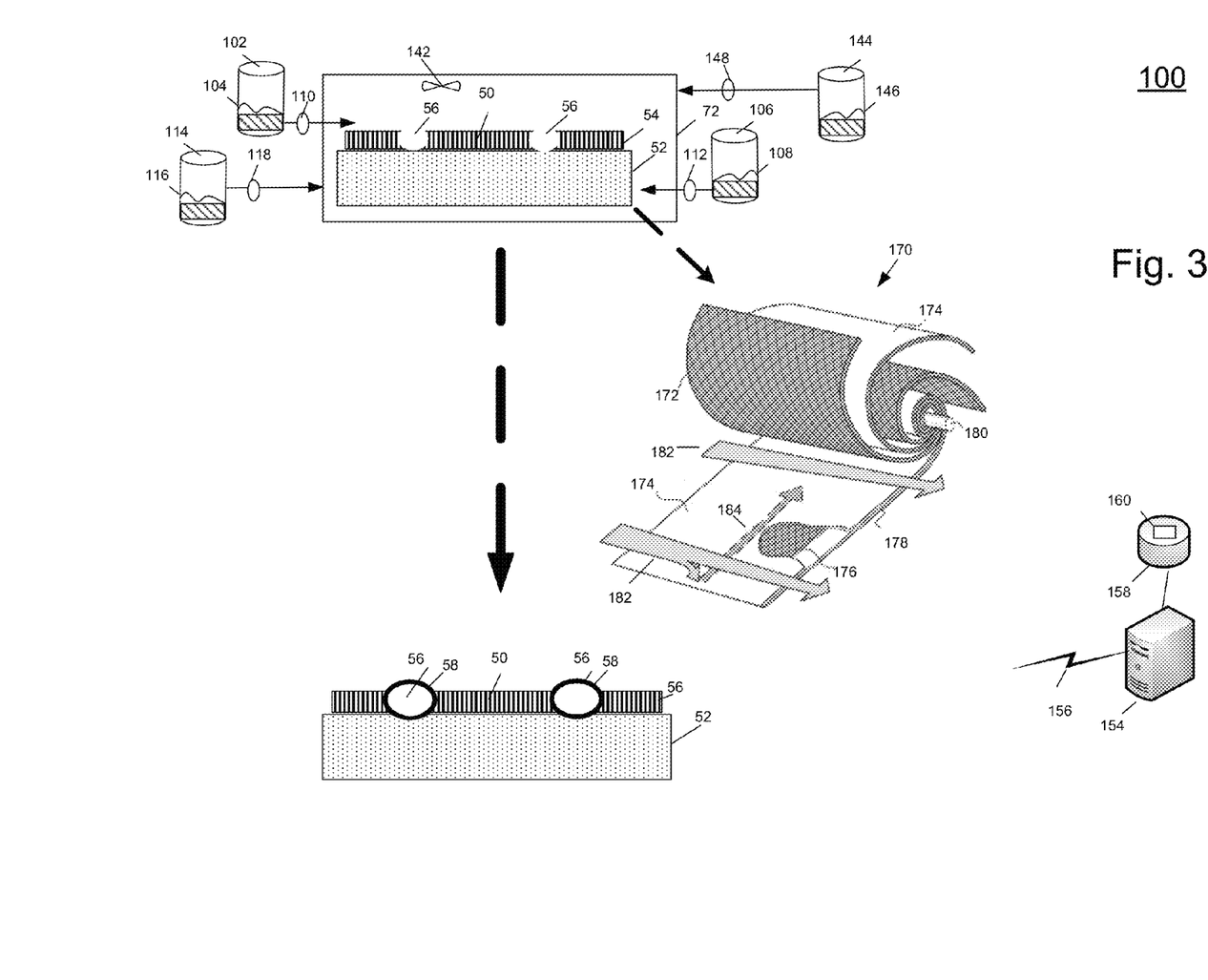
FIG. 3 illustrates an example system that can be utilized to implement repairing graphene on a porous support.

FIG. 3 illustrates an example system that can be utilized to implement repairing graphene on a porous support arranged in accordance with at least some embodiments described herein. FIG. 3 is substantially similar to system 100, with additional details. Those components in FIG. 3 that are labeled identically to components of FIGS. 1 and 2 will not be described again for the purposes of clarity.

System 100 may further include a container 114 configured in operative relationship with chamber 72. Container 114 may include a material 116. Material 116 may include a treating material such as toluene. Chamber 72 may be configured to operate with container 114, such as by processor 154 selectively controlling actuation of a port 118, to apply treating material 116 to graphene layer 54. For example, toluene may be applied through spiral wound module 170 and through layer 54 to remove air from layer 54.

Thereafter, chamber 72 may be configured to operate with container 102 to flow first material 104 over layer 54 and through hole 56. Chamber 72 may be configured to operate with container 102, such as by processor 154 selectively controlling actuation of a port 110. Similarly, chamber 72 may be configured to operate with container 106 to flow second material 108 through support 52 and through hole 56. Chamber 72 may be configured to operate with container 106, such as by processor 154 selectively controlling a port 112.

In some examples, first reactive material 104 may be combined with a liquid such as water or toluene 116 and flowed over layer 54. Second reactive material 108 may be combined with a liquid such as water or toluene 116 and flowed through support 52. In an example, first and second materials 104, 108 may be flowed through holes 56 for a time interval in a range of about 5 minutes to about 15 minutes. Thereafter, layer 54 may be washed with toluene from container 114 to remove residue of materials 104 and 108 on layer 54. Layer 54 may be cleaned with hexanes 146, such as from a container 144 through a port 148, to remove the toluene. Layer 54 may be dried with a flow of air such as from a fan 142.

First material 104 and second material 108 may each be a monomer, and plug 58 may be a polymer formed from these two monomers. First material 104 and second material 108 may be a molecule or a polymer. For example, first reactive material 104 may include an anhydride such as 1,4,5,8-naphthalenetetracarboxylic dianhydride in about 10 mM toluene solution. Second reactive material 108 may include a diamine such as ethylene diamine in about 10 mM toluene solution. In this example, monomers may be used to create a polymer plug 58. Polymer plug 58 may be insoluble in the toluene solvent and so plug 58 may physically remain where first and second materials react and not disperse through the toluene solvent. Moreover, the naphthalene monomer may have excellent pi-pi stacking interaction with graphene layer 54 which may help with adhesion between plug 58 and layer 54.

In other examples, first reactive material 104 and second reactive material 108 may form bonds at holes 56. These bonds may be covalent or non-covalent bonds, hydrogen bonds, ionic bonds, etc.

In an example, first reactive material 104 and second reactive material 108 may include complementary polyelectrolytes and a reaction may result in flocculation of these electrolytes. For example, first reactive material 104 may include a polycation such as poly(dimethyldiallylamine). Second reactive material 108 may include a polyanion such as poly (styrenesulfonate). In this example, ionic forces may be used to create plug 58 because ions may come out of solution where first and second reactive materials contact in holes 56. When the polycation and polyanion combine at holes 56, electrostatic attraction results in condensation to form a precipitate. In the polyelectrolyte example, plug growth may be self-limiting. Plug 58 begins to form as polycations and polyanions mix at hole 56. As more polycations and polyanions reacts, flow through hole 56 is impeded until eventually plug growth ceases. In these examples using polyelectrolytes, first material 104 and second material 108 may be combined with a solution of water, such as about 1 g/L water. First material 104 and second material 108 may be applied to layer 54 for a time interval in a range of about 2 minutes to about 10 minutes. Thereafter, layer 54 may be washed with water to remove materials 104, 108.

Figure 4:
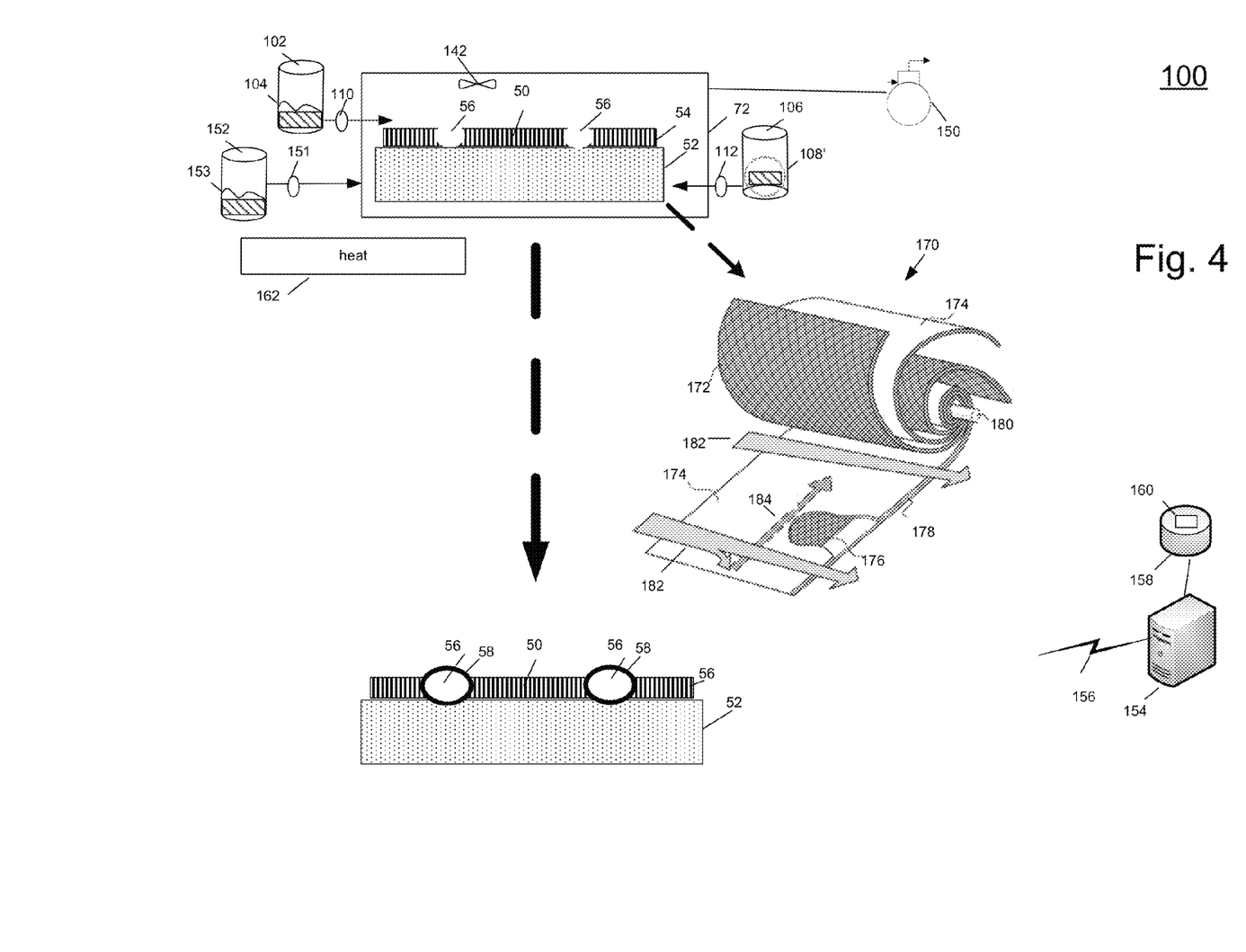
FIG. 4 illustrates an example system that can be utilized to implement repairing graphene on a porous support.

FIG. 4 illustrates an example system that can be utilized to implement repairing graphene on a porous support arranged in accordance with at least some embodiments described herein. FIG. 4 is substantially similar to system 100, with additional details. Those components in FIG. 4 that are labeled identically to components of FIGS. 1-3 will not be described again for the purposes of clarity.

In the example shown in FIG. 4, first material 104 may be in a liquid state and second material 108' may be in a gaseous state. Second material 108' may be, for example, water vapor. Second mater 108' may be a gas with a molecule size larger than pore 50. Second material 108' may be formaldehyde and first material 104 may be urea combined with water. First material 104 may be adjusted to a pH of about 8 to about 9 such as by adding an acid or base 153 such as from container 152 through selective actuation (i.e., controlled opening and closing) of port 151. First material 104 may be heated to a temperature in a range of about 35 degrees Celsius to about 50 degrees Celsius such as by heating device 162.

First reactive material 104 may be flowed over graphene layer 54 while an air pressure in a range of about 1 to 3 atmospheres may be applied through support 52. For example, a pump 150, controlled by processor 154, may be configured to provide the controlled pressure in the desired operating range. The pressure may help prevent first reactive material 104 from leaking through holes 56. A flow of first material 104 may be stopped and port 110 may be sealed. While first material 104 is on top of graphene layer 54, second reactive material 108' may be added to chamber 72. Second reactive material 108' may remain in chamber 72 for a time interval of about 5 to about 15 minutes. Second reactive material 108' may contact and react with first material 104 in holes 56. For example, if first reactive material 104 is urea and second reactive material 108' is formaldehyde, a urea-formaldehyde resin may be formed by reaction in chamber 72. Second reactive material 108' may be removed from chamber 72 through port 112 such as by flushing chamber 72 with air from pump 150. First reactive material 104 may be removed from chamber 72 such as by washing layer 54 with distilled water from container 152. Layer 54 may be thereafter dried by flowing air from pump 150.

Among other potential benefits, a system arranged in accordance with the present disclosure may facilitate use of graphene membranes produced with relatively high defect counts, and perhaps made using less expensive manufacturing processes. These produced membranes may be used without sacrificing graphene's relatively higher permeability/low membrane resistance or reducing the graphene's low gas transport selectivity. Such higher defect count membranes may be repaired by plugging undesired holes. Such undesired holes may otherwise degrade the membrane's ability to sieve molecules based on size. Undesired holes may be plugged while a remainder of a membrane may still be unobstructed and used. Graphene may be prepared on one support and transferred to a porous support. The transferring may cause tears or create undesired holes. A process as described herein may be used to repair such holes.

Figure 5:
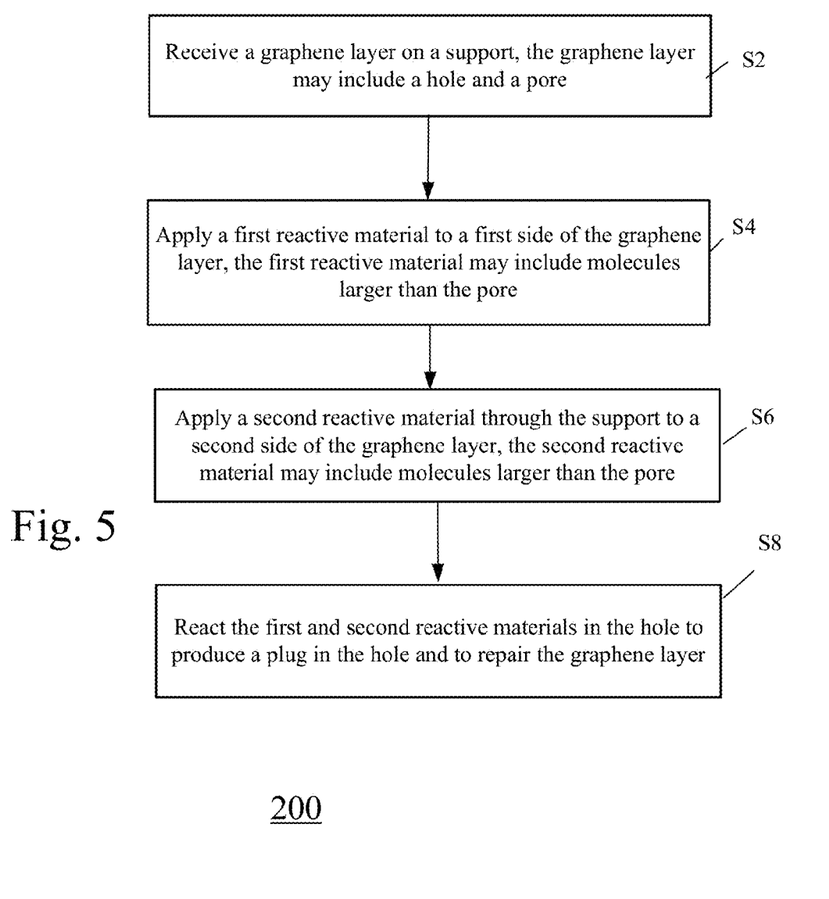
FIG. 5 depicts a flow diagram for an example process for implementing repairing graphene on a porous support.

FIG. 5 depicts a flow diagram for an example process 200 for implementing repairing graphene on a porous support arranged in accordance with at least some embodiments described herein. The process in FIG. 2 could be implemented using, for example, system 100 discussed above. An example process may include one or more operations, actions, or functions as illustrated by one or more of blocks S2, S4, S6 and/or S8. Although illustrated as discrete blocks, various blocks may be divided into additional blocks, combined into fewer blocks, or eliminated, depending on the desired implementation.

Process 200 may begin at block S2, "Receive a graphene layer on a support, the graphene layer may include a hole and a pore." At block S2, a chamber may be configured effective to receive a graphene layer on a support. For example, the chamber may include a spiral wound support. In some examples, a treating material, such as toluene, may be applied to the graphene layer to remove at least some air in the graphene layer.

Processing may continue from block S2 to block S4, "Apply a first reactive material to a first side of the graphene layer, the first reactive material may include molecules larger than the pore." In block S4, the chamber may be configured effective to collaboratively operate with one or containers via their respective ports to apply a first reactive material to a first side of the graphene layer. The first reactive material may be combined in a solution such as toluene in one of the containers. The first reactive material may be a monomer, an anhydride, 1,4,5,8-naphthalenetetracarboxylic dianhydride, a complementary polyelectrolyte, a polycation, poly(dimethyldiallylamine), and/or urea.

Processing may continue from block S4 to block S6, "Apply a second reactive material through the support to a second side of the graphene layer, the second reactive material may include molecules larger than the pore." At block S6, the chamber may be configured effective to operate with one or more containers via their respective ports to apply a second reactive material to a second side of the graphene layer. The second reactive material may be combined in a solution such as toluene in one of the containers. The second reactive material may be a monomer.

The first reactive material may be an anhydride and the second reactive material may be a diamine. The first reactive material may be 1,4,5,8-naphthalenetetracarboxylic and the second reactive material may include ethylene diamine. The first and second reactive materials may include complementary polyelectrolytes. The first reactive material may include poly(dimethyldiallylamine) and the second reactive material may include poly(styrenesulfonate). The second reactive material may be in a liquid state, a gaseous state or combination liquid-gaseous state. The first reactive material may be urea and the second reactive material may be formaldehyde.

Processing may continue from block S6 to block S8, "React the first and second reactive materials in the hole to produce a plug in the hole and to repair the graphene layer." At block S8, depending on the materials selected, the first and second materials may react to produce a plug in the hole.

Figure 6:
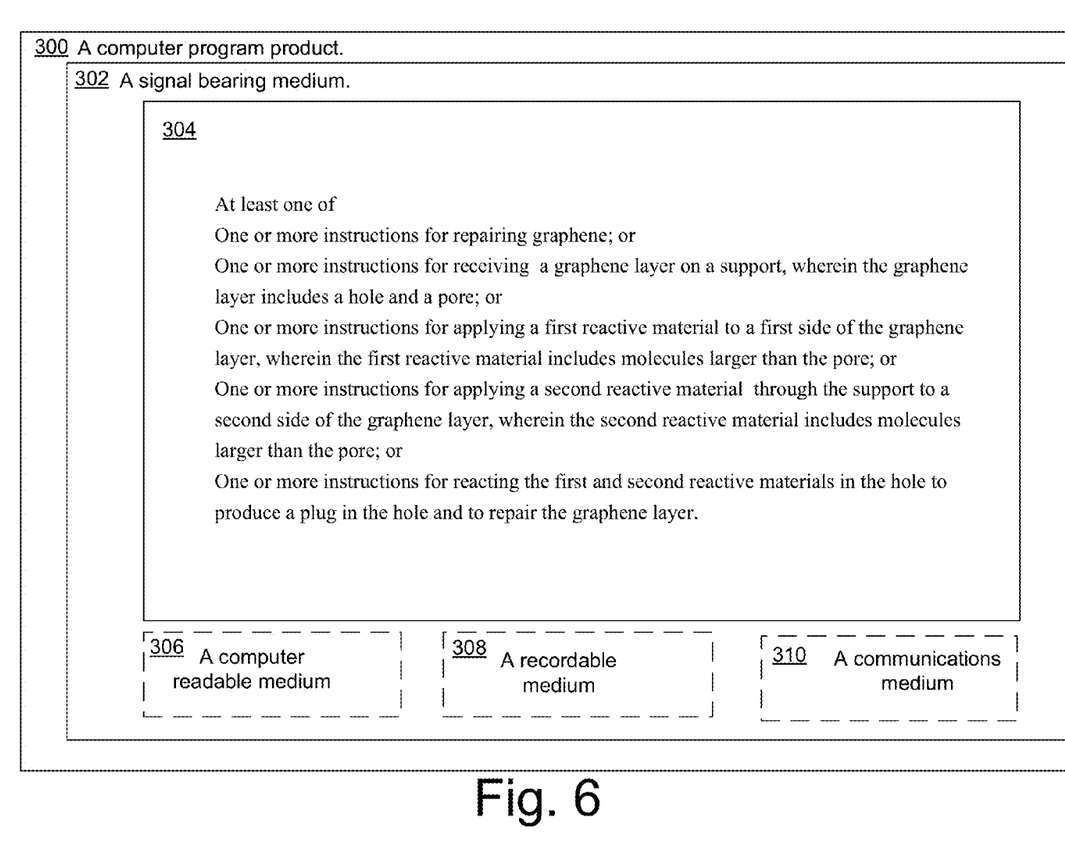
FIG. 6 illustrates a computer program product that can be utilized to implement repairing graphene on a porous support.

FIG. 6 illustrates a computer program product that can be utilized to implement repairing graphene on a porous support arranged in accordance with at least some embodiments described herein. Program product 300 may include a signal bearing medium 302. Signal bearing medium 302 may include one or more instructions 304 that, when executed by, for example, a processor, may provide the functionality described above with respect to FIGS. 1-5. Thus, for example, referring to system 100, processor 154 may undertake one or more of the blocks shown in FIG. 6 in response to instructions 304 conveyed to the system 100 by medium 302.

In some implementations, signal bearing medium 302 may encompass a computer-readable medium 306, such as, but not limited to, a hard disk drive, a Compact Disc (CD), a Digital Video Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, program product 300 may be conveyed to one or more modules of the system 100 by an RF signal bearing medium 302, where the signal bearing medium 302 is conveyed by a wireless communications medium 310 (e.g., a wireless communications medium conforming with the IEEE 802.11 standard).

Figure 7:
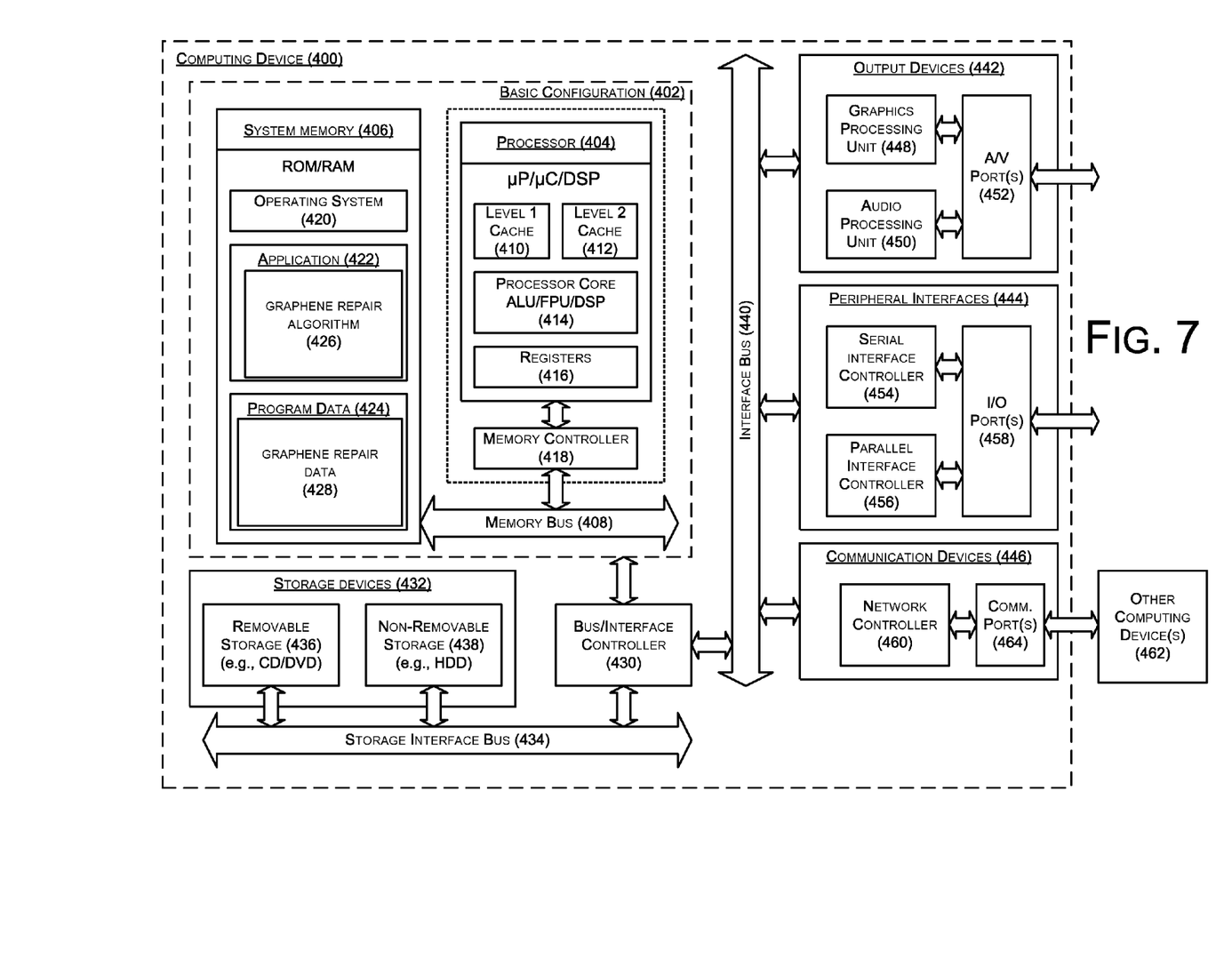
FIG. 7 is a block diagram illustrating an example computing device that is arranged to implement repairing graphene on a porous support.

FIG. 7 is a block diagram illustrating an example computing device that is arranged to implement repairing graphene on a porous support according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (µP), a microcontroller (µC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include a graphene repair algorithm 426 that is arranged to perform the various functions/actions/operations as described herein including at least those described with respect to system 100 of FIGS. 1-6. Program data 424 may include graphene repair data 428 that may be useful for implementing repairing graphene on a porous support as is described herein. In some embodiments, application 422 may be arranged to operate with program data 424 on operating system 420 such that repairing graphene on a porous support may be provided. This described basic configuration 402 is illustrated in FIG. 7 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for repairing a hole in a graphene layer, the method comprising:
    receiving the graphene layer on a support, wherein the graphene layer includes the hole and a pore, wherein the hole is larger than the pore;
    applying a first reactive material to a first side of the graphene layer, wherein the first reactive material includes molecules larger than the pore;
    applying a second reactive material through the support to a second side of the graphene layer, wherein the second reactive material includes molecules larger than the pore; and
    reacting the first and second reactive materials in the hole to produce a plug in the hole and to repair the graphene layer.

2. The method of claim 1, further comprising, before applying the first and second reactive material, winding the graphene layer and support on a spiral wound support.

3. The method of claim 1, further comprising, before applying the first and second reactive material, applying a treating material to the graphene layer effective to remove at least some air in the graphene layer.

4. The method of claim 1, further comprising, before applying the first and second reactive material, applying toluene to the graphene layer effective to remove at least some air in the graphene layer.

5. The method of claim 1, further comprising:
applying the first reactive material combined in solution with a first liquid; and
applying the second reactive material combined in solution with a second liquid.

6. The method of claim 1, further comprising:
applying the first reactive material combined in solution with toluene; and
applying the second reactive material combined in solution with toluene.

7. The method of claim 1, wherein the method further comprises, after reacting:
washing the graphene layer with toluene to form a washed graphene layer;
cleaning the washed graphene layer with hexanes to form a clean graphene layer; and
drying the clean graphene layer.

8. The method of claim 1, wherein:
the first reactive material is a first monomer;
the second reactive material is a second monomer; and
the plug is a polymer.

9. The method of claim 1, wherein:
the first reactive material includes an anhydride; and
the second reactive material includes a diamine.

10. The method of claim 1, wherein:
the first reactive material includes 1,4,5,8-naphthalenetetracarboxylic dianhydride; and
the second reactive material includes ethylene diamine.

11. The method of claim 1, wherein the first and second reactive materials form bonds in the hole.

12. The method of claim 1, wherein the first and second reactive materials include complementary polyelectrolytes.

13. The method of claim 1, wherein:
the first reactive material includes a polycation; and
the second reactive material includes a polyanion.

14. The method of claim 1, wherein:
the first reactive material includes poly(dimethyldiallylamine); and
the second reactive material includes poly(styrenesulfonate).

15. The method of claim 1, wherein the second reactive material is in a gaseous state.

16. The method of claim 1, wherein the second reactive material is water vapor.

17. The method of claim 1, wherein:
the first reactive material is urea; and
the second reactive material is formaldehyde.

18. The method of claim 1, further comprising: applying pressure with a pump through the support while applying the first material, the applied pressure sufficient to prevent the first material from flowing through the graphene layer.

19. A system effective to repair a hole in a graphene layer on a support, the graphene layer including the hole and a pore, wherein the hole is larger than the pore, the system comprising:
a chamber effective to receive the graphene layer on the support;
a first container in operative relationship with the chamber, wherein the first container includes a first reactive material, wherein the first reactive material includes molecules larger than the pore; and
a second container in operative relationship with the chamber, wherein the second container includes a second reactive material, wherein the second reactive material includes molecules larger than the pore;
wherein the chamber is effective to
operate with the first container to apply the first reactive material to a first side of the graphene layer, wherein the first reactive material includes molecules larger than the pore;
operate with the second container to apply the second reactive material through the support to a second side of the graphene layer, wherein the second reactive material includes molecules larger than the pore; and
operate with the first and the second container to react the first and second reactive materials in the hole to produce a plug in the hole and to repair the graphene layer.

20. The system of claim 19, wherein the first and the second containers are different.

21. The system of claim 19, wherein the chamber includes a spiral wound support.

22. A structure comprising:
a porous support, the porous support including pores of a first size;
a graphene layer on the support, the graphene layer including a hole, the graphene layer further including a pore of a second size; and
a plug in the hole, the plug including
a first material with molecules having a third size larger than the second size and smaller than the first size; and
a second material with molecules having a fourth size larger than the second size and smaller than the first size.

23. The structure of claim 22, wherein the first and second reactive materials form bonds in the hole.

* * * * *